United States Patent [19]

Weisman

[11] 3,878,438

[45] Apr. 15, 1975

[54] PRINTED CIRCUIT CARD GUIDE

[75] Inventor: Arnold M. Weisman, Los Angeles, Calif.

[73] Assignee: William Jacobs a/k/a Calmark, San Marino, Calif.

[22] Filed: Sept. 28, 1973

[21] Appl. No.: 401,895

[52] U.S. Cl. .............................. 317/101 DH; 211/41

[51] Int. Cl. .............................................. H02b 1/02

[58] Field of Search ................. 317/101 DH; 211/41

[56] References Cited

UNITED STATES PATENTS

| | | | |
|---|---|---|---|
| 3,184,069 | 5/1965 | Rosenberg | 211/41 |
| 3,511,385 | 5/1970 | Ayling | 317/101 DH |
| 3,664,510 | 5/1972 | Kerschbaum | 211/41 |
| 3,696,936 | 10/1972 | Straccia et al. | 317/101 DH |

*Primary Examiner*—David Smith, Jr.

[57] ABSTRACT

An apparatus for mounting and fastening printed circuit boards or cards within a panel rack or chassis, in connection with electronic equipment or the like. The mounting frames are capable of receiving a one piece flexible guide which snaps onto the frame and requires no mounting holes or fasteners. In addition, the mounting frames have large rectangular apertures for providing maximum air circulation.

4 Claims, 5 Drawing Figures

PRINTED CIRCUIT CARD GUIDE

BACKGROUND OF THE INVENTION

1. Field of the Invention

This invention relates to mounting and fastening printed circuit boards or cards within a rack or chassis.

2. Prior Art

Printed circuit boards are normally held in a frame, chassis or other suitable housing. A critical factor to consider in designing chassis to contain printed circuit boards is that, the dimension between the top of the top frame and the bottom of the bottom frame is fixed. This dimension is fixed by industry standards based on the standard size of the printed circuit board. This limited dimension requires that special care be taken in design to take into account factors such as:

making the frames rigid enough to support printed circuit boards, providing sufficient areas in the frames for air cooling, and also providing sufficient insulation for electrically isolating each printed circuit board. However, each of these factors also affect the rigidity of the frame. Thus, whenever the total thickness or depth of the frame is reduced, the rigidity of the frame is also reduced. If apertures are added for air cooling the rigidity of the frame is lessened because of the decreased area of the frame to resist bending. If a layer of insulation is added, the frame thickness is decreased proportionally. Therefore, an adequate design must provide for insulation and maximum air cooling while allowing the frame to be as rigid as possible.

Many prior art methods for accomplishing these purposes have been attempted. One such method is to fabricate the frames from solid sheet metal, and dispose on the sheet a plastic or insulative printed circuit board holder. The insulated holder is secured to the sheet metal frame by tabs formed as an integral part of the insulative holder. These tabs were disposed through preformed apertures in the frame. However, burrs would often remain in the preformed apertures and the tabs would not properly fit, or even worse, slight variations in dimensions of the tabs or the apertures, can result in the tabs not properly fitting into the apertures. There exists no method to adjust for these slight misalignments.

When these solid frames are employed, they must contain a plurality of apertures to provide for air circulation and cooling. However, the more apertures that were disposed in solid frame the less rigid the plate became, since the rigidity is primarily dependent upon the amount of metal in the cross section. Hence, proper ventilation is a problem with these solid frames, since the greater the area for ventilation the smaller the area available for rigidity. If proper ventilation does not occur the effectiveness of the printed circuit boards will be impaired. Since this type of frame derives its rigidity from the available cross section area, the thickness of the frame must be increased to compensate for the area removed for cooling.

Other prior art devices are formed using generally channel shaped frames having large apertures providing for air circulation. These type of frames are formed from much thinner metal than the solid frames and provided increased rigidity, while allowing a greater air circulation. These apertures define thin web sections which extend across the width of the frame. One method used to contain the printed circuit cards is to bend these thin web sections into small sections having channel shaped cross section. The flanges extend upward from the frame and are capable of receiving the printed circuit cards. This type of prior art device is illustrated in FIG. 1 and labeled generally 17. The problem with this device was that the printed circuit board was not completely electrically isolated from the frame which is a necessity in some instances. A method for solving this problem required that the entire surface of the frame be coated with an electrically isolating material. This coating provided the electrical isolation but had other problems such as increasing the cost since a substantial amount of material is required to coat the entire surface of the frame, and also inspection was required to insure continuity of the coating. An additional problem persists since the frame could not be spot welded to the side panels, which is the preferred fastening means. Thus, the cost of assembling and manufacturing the chassis for containing printed circuit boards is sufficiently greater than in the present invention.

Other devices were employed which also used a channel shaped frame having a perforated web, such as U.S. Letters Pat. No. 3,213,785 and other devices, such as that illustrated in FIG. 1 and labeled generally 18. These type of devices employed a spring-like metal retraining means which secured the card or plate into place on the metal frames. These devices were normally secured to the frame by rivets or mounting bolts or snap-like protrusions which were disposed within preformed apertures in the metal frame. One problem with these type of devices is in the assembly cost. The devices often require many different pieces to be assembled and apertures drilled or punched into the frames which received tabs, rivets or bolts. An additional problem with these devices is that they do not electrically isolate the printed circuit cards from the frame, and hence other methods for electrically isolating the printed circuit boards or frames had to be divised.

The present invention solves these problems by providing a one piece snap-on flexible card guide which requires no mounting holes or fasteners. It also provides a means for electrically isolating the cards from the containing chassis and frame. The frame of the present invention has a maximum amount of apertures for providing a maximum amount of air circulation. Another advantage is that the frame is formed from a minimum amount of material which provides a savings since a minimum amount of material is used in the frame and the card guide. Thus, since the amount of material is reduced the cost for fabricating this device is lowered. Lastly, the device provides a flexible insert which is easy to install and does not require any tools or trained personnel. Also, the card guide insert is self-adjusting to account for any manufacturing errors occuring in either the card guide or the apertures formed in the metal frame.

SUMMARY OF THE INVENTION

The chassis for containing the printed circuit boards or cards is comprised of side panels coupled to a top and bottom frame. The top and bottom frames are mirror images of each other and are generally channel shaped. The flanges of the frame provide rigidity while the web is adapted to receive flexible card guides. The one piece flexible card guide snaps onto the frame and requires no mounting holes or fasteners. The card guide is generally rectangular in cross section having a length approximately equal to the width of the frame. The guide has a rectangular trough which is capable of receiving, securing and electrically isolating a printed circuit card. The guide is secured in position by tabs which prevent longitudinal and verticle movement. Rectangular apertures are disposed in the webs of the frames for providing a maximum amount of air ventilation, while using a minimum amount of material.

It is an object of this invention to provide a rigid frame for a mounting chassis which will support and provide a maximum amount of ventilation for printed circuit boards or cards.

It is another object of this invention to electrically isolate the printed circuit boards from the mounting chassis and frames.

DETAILED DESCRIPTION OF THE PREFERRED EMBODIMENT

Figures 1, 2:
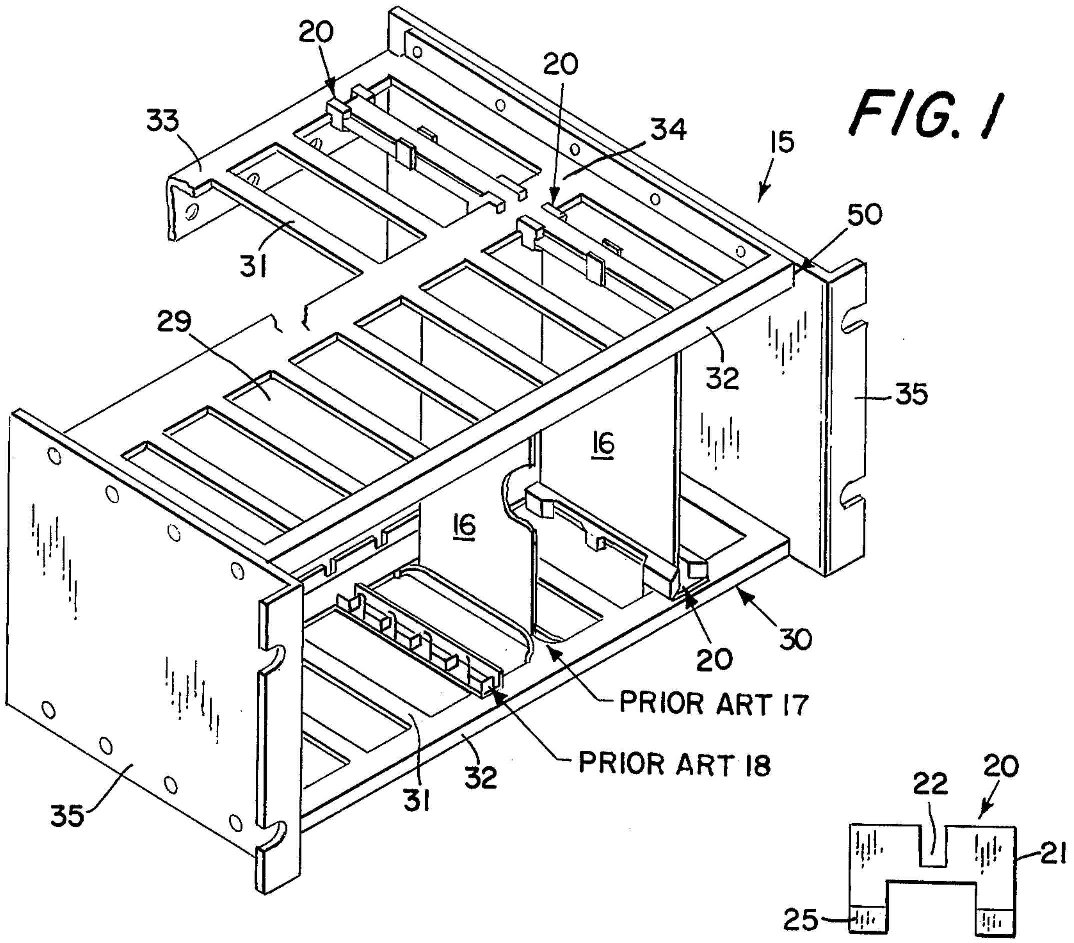
FIG. 1 is a pictorial drawing of a chassis for containing printed circuit boards, illustrating both the present invention and prior art.
FIG. 2 is a blown-up end view of the card guide.

Referring first to FIG. 1 the presently preferred embodiment along with prior art methods for retaining printed circuit boards are shown in a chassis. The chassis must be formed such that a standard size printed circuit board may be held between the top and bottom frames and still be easily inserted and withdrawn. The chassis 15 in the presently preferred embodiment is comprised of two end panels 35 and top and bottom frames 50 and 30. The chassis 15 is generally rectangular in shape. The side panels 35 are mounted perpendicular to the top and bottom frames 50 and 30, by spot welding or other means well known in the art. Each chassis so constructed may hold a plurality of printed circuit boards 16. The chassis in FIG. 1 may hold seven printed circuit boards at one time, however only two are shown for illustration purposes.

The present invention is a structure for containing printed circuit boards 16. The chassis 15 in the presently preferred embodiment has similar dimensions to those used in the prior art, since printed circuit boards 16 are manufactured to a standard dimension. Since printed circuit boards 16 are manufactured to a specific size and since the dimensions of the chassis 15 are controlled by the industry, any apparatus for containing the printed circuit boards must take this into account.

The top and bottom frames 50 and 30, in the presently preferred embodiment, are formed such that one is the mirror image of the other. Thus, hereinafter only one frame will be described in detail. The bottom frame 30 is formed from a flat piece of sheet metal which is generally rectangular in shape, having a width slightly larger than the width of the printed circuit boards. The length of the frame 30 is variable depending upon the number of printed circuit boards desired to be contained in the chassis. The frame 30 is constructed from a flat rectangular piece of sheet metal which has been processed through a stamping machine, which forms the flat sheet into a generally channel shaped member, such that the flanges form the longitudinal edges 32 and 33 of the frame 30. The web of this channel shaped member is perforated with a plurality of rectangular openings 29. These openings 29 extend across the width of the frame 30 having length approximately equal to the length of a printed circuit board 16, and in the presently preferred embodiment is 2.875 inches in length. The width of the opening 29 may vary depending upon the number of printed circuit boards to be contained within each chassis, however, the remaining web 31 between each opening 29 in the presently preferred embodiment is 0.200 inches across. Thus, the finish frame 30 has a front flange 32 and back flange 33, extending along each longitudinal side and a plurality of webs 31, connecting the front and back flanges 32 and 33, which define the rectangular openings 29. The flanges 32 and 33 provide the rigidity for frame 30 while the web 31 serves as the supporting surface for the printed circuit card guides 20. The large openings 29 serve to allow maximum air circulation, which provides for maximum cooling of the printed circuit boards 16. In the presently preferred embodiment the openings are rectangular, however in alternate embodiments the openings may take various other configurations.

Figure 3:
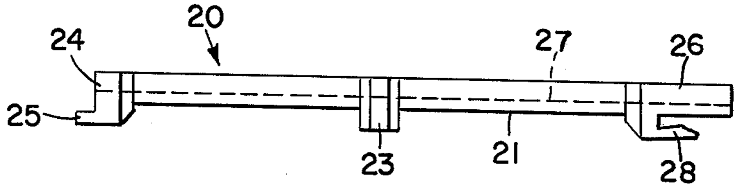
FIG. 3 is a blown-up side view of the card guide.

A card guide 20 is disposed on top of each web 31 in the top and bottom frames 30 and 50. The card guides 20 are generally rectangular in cross section, having a length slightly greater than the length of the opening 29, and a width approximately equal to the width of the web 31. Disposed longitudinally into this rectangular cross section is a rectangular trough 22, best shown in FIG. 2. This trough 22 extends across the entire length of the card guide 21 and is formed so as to be capable of receiving the printed circuit cards 16 while providing an insulative means for electrically isolating the printed circuit card. End 24 of the card guide 20 has a thickened rectangular cross section and disposed toward the bottom of this thickened cross section are two tabs 25, best shown in FIG. 3 and 4. The tabs 25 extend in a direction perpendicular to end 24 and parallel to the body 21 and project away from end 29. The tabs 25 are disposed below the body 21 of the card guide, a distance equal to the thickness of the web 31 of frame 30. End 26 of the card guide is also thickened in cross section and has two tabs 28 which are disposed below the body of the card guide, a distance equal to the thickness of the web 31 of the bottom frame 30. These tabs also extend approximately parallel to the body of the card guide 30 toward end 26, however, they are slightly inclined toward the base of the body 21 so as to decrease the dimension between the base of the body 21 and the tabs 28. The tabs 28 are disposed inwardly from end 26 such that as end 24 engages one side of opening 29, the back of tabs 28 will engage the opposite side of opening 29. An additional feature is that tabs 28 are disposed inwardly so as to extend toward end 26 such that small variances are compensated for, either in the size of the opening 29 or the card guide 20.

Figures 4, 5:
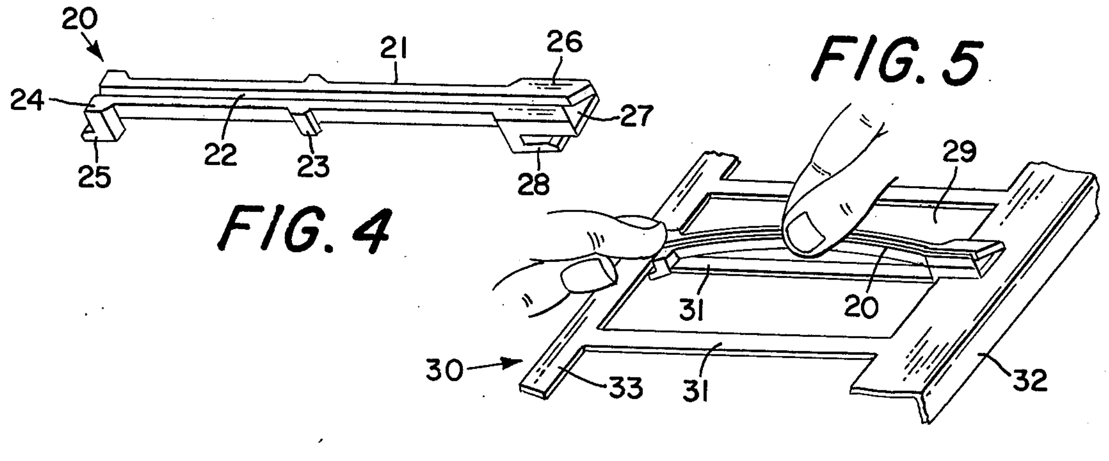
FIG. 4 is a pictorial view of the card guide.
FIG. 5 is a pictorial view of the card guide being place onto the frame.

The upper surface of the tip of end 26 contains an indexing guide 27, and is best shown in FIG. 4. The indexing guide is created by extending on approximately a 45° angle the edges of the trough until they intersect the end of the thickened portion. Lateral guides 23 are disposed on the body 21 of the card guide and are located at the mid-point between end 24 and end 26.

Two lateral guides 23 extend from the body 21 of the card guide 20 vertically downward a distance which is slightly greater than the thickness of the web 31 of frame 30. The lateral guides 23 disposed one from the other, a distance equal to the width of the web 31 which is also the thickness of the card guide 20. In the presently preferred embodiment only one pair of lateral guides 23 are employed, however in alternate embodiments several pair or just a plurality of lateral guides could be used.

The card guide 20 which may be fabricated from molded nylon, is snapped into place, by hand, onto the top of frame 30 so as to be disposed over web 31 (see FIG. 5). The card guide provides an electrically nonconductive means of securing and supporting the printed circuit cards 16. The card guide 20 is snapped into place as shown in FIG. 5. First, end 26 is positioned near the front flange 32 while the body 21 overlies the web 31 of frame 30. Tabs 28 on end 26 are then disposed beneath web 31 of the bottom frame such that each tab 25 is disposed in an adjacent opening 29, while the body 21 extends along web 31. The card guide 20 is then bowed along its longitudinal axis until tabs 25 can be inserted beneath the web 31 of frame 30.

Once the tabs are inserted beneath frame 30, the body 21 of the card guide is disposed such that it lies on top of the of the web 31, by pushing down on the body 21 near the lateral guides 23 as shown in FIG. 5. The force created by pushing down on the body 21 causes end 24 to be properly positioned, such that one tab 25 is disposed in each of adjacent openings 29. The lateral guides 23 are disposed so as to engage the opposite sides of web 31.

The card guides are firmly held into position by tabs 25, 28 and lateral support guides 23. It should be noted that the tabs 28 are designed such that they may compensate for small errors which may occur in the stamping or molding process and to allow for material thickness variations of the frame, yet securely fasten the card guide to frame 30. In use a card guide 20 is mounted on both the top and bottom frames 50 and 30 such that a printed circuit card can be inserted and held by the upper and lower card guide. It should also be noted that the present invention is mounted in place on a metal chassis and requires no mounting holes or fasteners.

The present invention may be used in combinations, one behind the other, such that printed circuit boards of greater widths may be contained in a similar fashion. In this instance, multiples of the present invention may be combined as is illustrated by the extended top frame 50 in FIG. 1. In this use, the top frame 50 contains two rows of openings 29. Each row containing openings 29 which are similar to the openings 29 previously described. These openings 29 are positioned such that the webs 31 in the adjoining rows are in alignment. Thus, by disposing the card guides 20 in position on both the top and bottom frames 50 and 30 an enlarged printed circuit card may be inserted into the card guides and be secured in place, without requiring any changes in the primary design of the card guide 20 or openings 29. The only change being that the top and bottom frames will be similar to the top frame 50 and will have a solid section 34 disposed between the adjacent rows of openings 29 forming a portion of the web 31. This type of application, having the increased span, significantly affected many prior art chassis. However, in the present invention the flanges provide the additional rigidity required and make this type of application perfectly suitable.

Thus, the present invention provides a means of guiding and supporting printed circuit cards, while elctrically isolating the cards. The present invention also provides for maximum ventilation by having a maximum open area, which also reduces the cost because of the saving in metal used. The flexible card guide is easily mounted in place on the frames of the chassis and do not require rivets, apertures or protrusions to be formed in either the frame or the card guide.

I claim:

1. An apparatus for containing, electrically isolating and cooling circuit cards comprising:

a. a chassis having a top frame and a bottom frame, said top and bottom frames being generally channel shaped having two flanges and a web disposed such that said flanges increase the rigidity of said frames, while said web, supports said circuit cards, said web having a plurality of web sections defining openings, wherein a substantial portion of the sides of said web sections are parallel;

b. a card guide being generally elongated with a rectangular cross section, said card guide having;

1. a body containing a generally rectangular shaped trough disposed along the longitudinal axis of said body, said trough having a width slightly larger than the thickness of said circuit cards;

2. a first end having two tabs which are positioned beneath said body a distance approximately equal to the thickness of said frame, said tabs project outwardly from said first end, said tabs being positioned on each side of said body such that said tabs each engage the bottom of said frame in adjacent openings;

3. a second end having two tabs which are positioned beneath said body a distance approximately equal to the thickness of said frame, said tabs positioned so as to extend toward said second end such that the distance between said tabs on said first end and said tabs on said second end is approximately equal to the length of said opening, said tabs disposed on each side of said body such that said tabs each engage the bottom of said frame in adjacent openings; and 4. a pair of longitudinal guides disposed on the side of said body and extending downward from said body such that each tab engages a side of said web section in adjacent openings;

whereby said card guide may be disposed on and supported by said thin web section, and said circuit cards may be contained within said chassis.

2. An apparatus for containing circuit cards comprising:

a. a chassis having a top frame and a bottom frame, said top and bottom frames being generally channel shaped having a web and two flanges, said web containing a plurality of oppositely disposed sections; and b. a card guide with an elongated body having a trough disposed in said body along its longitudinal axis, said card guide capable of being disposed on each of said oppositely disposed web sections and secured in position thereon, said trough being capable of receiving and retaining said circuit cards, the length of said card guide being slightly longer than the length of said web section, said card guide being generally rectangular in cross section having:

a. a first end with tabs which are positioned beneath the body of said card guide and extend outward from said first end;

b. a second end, said second end having tabs positioned beneath said body of said card guide disposed inwardly from said second end such that said tabs on said second end extend towards said second end; and c. at least one pair of lateral support guides disposed intermediate said first and second ends of said card guide, which extend downward from said body of said card guide;

whereby said tabs on said first end are engageable with one side of the opening between adjacent web sections, said tabs in the vicinity of said second end engageable with the opposite side of said opening, said lateral support guides being engageable with the sides of said web sections such that said card guide is disposed on, secured to and supported by said oppositely disposed web section, whereby said circuit cards may be disposed in said apparatus and secured into position.

3. The apparatus of claim 2 wherein the body of said second end has an indexing guide formed by beveling said second end.

4. The apparatus of claim 2 wherein said tabs are disposed beneath the body of said card guide a distance equal to the thickness of said frame.

* * * * *